United States Patent
Dehm et al.

(10) Patent No.: US 6,670,662 B1
(45) Date of Patent: Dec. 30, 2003

(54) SEMICONDUCTOR STORAGE COMPONENT WITH STORAGE CELLS, LOGIC AREAS AND FILLING STRUCTURES

(75) Inventors: Christine Dehm, Nuremberg (DE); Guenther Schindler, Munich (DE)

(73) Assignee: Infineon Technologies, AG, Munich (DE)

(*) Notice: Subject to any disclaimer, the term of this patent is extended or adjusted under 35 U.S.C. 154(b) by 16 days.

(21) Appl. No.: 09/980,386
(22) PCT Filed: Jun. 6, 2000
(86) PCT No.: PCT/DE00/01868
§ 371 (c)(1),
(2), (4) Date: Mar. 19, 2002
(87) PCT Pub. No.: WO00/79587
PCT Pub. Date: Dec. 28, 2000

(51) Int. Cl.[7] .............................. H01L 27/108
(52) U.S. Cl. ............................ 257/296; 257/306
(58) Field of Search ................... 257/296, 300, 257/306, 307, 308, 309, 310, 311; 438/253, 254, 255, 396, 397, 398

(56) References Cited

U.S. PATENT DOCUMENTS

| | | | |
|---|---|---|---|
| 6,380,574 B1 | * | 4/2002 | Torii et al. .................. 257/295 |
| 2002/0192901 A1 | * | 12/2002 | Kimura et al. .............. 438/253 |

FOREIGN PATENT DOCUMENTS

| | | |
|---|---|---|
| DE | 19935947 A1 | 2/2000 |
| JP | 8-46149 | 2/1996 |
| JP | 8-162618 | 6/1996 |
| JP | 9-199679 | 7/1997 |

* cited by examiner

Primary Examiner—Tuan H. Nguyen
(74) Attorney, Agent, or Firm—Jenkins, Wilson & Taylor, P.A.

(57) ABSTRACT

The invention provides a semiconductor memory component with random access, also having a structure which is differentiated into memory cells and logic regions and has a lower oxide layer arranged on a silicon substrate and an upper oxide layer arranged on the lower oxide layer, each memory cell comprising at least one transistor in the transition region between silicon substrate and lower oxide layer and a capacitor in the transition region between lower oxide layer and upper oxide layer, which capacitor is connected to the transistor via a contact hole, which is filled with metal, in the lower oxide layer and comprises a ferroelectric arranged between two electrodes, the electrode which is connected to the transistor and adjoins the lower oxide layer having a relatively great thickness, and each logic region comprising at least one transistor in the transition region between silicon substrate and lower oxide layer, which transistor is connected to an electrode on the topside of the upper oxide layer via a contact hole, which is filled with metal, in the lower oxide layer and the upper oxide layer. According to the invention, it is provided that between the capacitors of the memory cells and the contact holes in the logic regions, level compensation between the topology of the memory cells and of the logic regions is created by dummy structures.

10 Claims, 1 Drawing Sheet

SEMICONDUCTOR STORAGE COMPONENT WITH STORAGE CELLS, LOGIC AREAS AND FILLING STRUCTURES

TECHNICAL FIELD

The present invention relates to a nonvolatile or volatile semiconductor memory component, having memory cells, logic regions and dummy structures with random access, also having a structure which is differentiated into memory cells and logic regions and has a lower oxide layer arranged on a silicon substrate and an upper oxide layer arranged on the lower oxide layer, each memory cell comprising at least one transistor in the transition region between silicon substrate and lower oxide layer and a capacitor in the transition region between lower oxide layer and upper oxide layer, which capacitor is connected to the transistor via a contact hole, which is filled with metal, in the lower oxide layer and comprises a ferroelectric arranged between two electrodes, the electrode which is connected to the transistor and adjoins the lower oxide layer having a relatively great thickness, and each logic region comprising at least one transistor in the transition region between silicon substrate and lower oxide layer, which transistor is connected to an electrode on the topside of the upper oxide layer via a contact hole, which is filled with metal, in the lower oxide layer and the upper oxide layer.

Semiconductor memory components of this type having a ferroelectric capacitor or a capacitor with a high dielectric constant are known, for example, from U.S. Pat. No. 5,854, 104 and EP 0 516 031 A1 and are also known as FRAMs or DRAMs. Examples of suitable materials for the ferroelectric of the capacitor are SBT (SBT stands for $SrBi_2Ta_2O_9$) and SBTN (SBTN stands for $SrBi_2(Ta_{1-x}Nb_x)_2O_9$) or PZT (PZT stands for $Pb(Zr_{1-x}Ti_x)O_3$).

The subject matter of the invention also relates in particular to DRAMs which operate with BST (BST stands for $Ba_{1-x}Sr_xTiO_3$) or $Ta_2O_3$ as the dielectric. These materials also require Pt or the like as an electrode. Moreover, relatively thick lower electrodes are required in order also to use the side wall, on account of the relatively high integration densities.

Platinum, iridium, iridium dioxide, ruthenium, ruthenium dioxide, palladium, strontium-ruthenium trioxide or combinations thereof are usually employed as the material for the thicker electrode of the capacitor, which electrode is connected to the transistor of the corresponding memory cell.

The thickness of this electrode, also referred to below as the lower electrode, is several hundred nanometers, depending on the capacitance required of the ferroelectric capacitor. The ferroelectric or material with a high dielectric constant which is deposited on the thick electrode also contributes to the overall thickness of the capacitor structure. The counterelectrode is deposited on the outside of the ferroelectric or material of high dielectric constant; this counterelectrode is also referred to below as the upper electrode. The overall result is a capacitor structure which is several hundred nanometers thick.

Since this capacitor structure only exists in the cell array of the semiconductor memory component in question, while similarly thick structures do not occur in the logic region of the semiconductor memory component, there is a considerable difference in topology between the cell arrays and the remaining part of the semiconductor memory component, i.e. the logic regions. This topology makes the metalization of the semiconductor memory component considerably more difficult during the fabrication of this component. Moreover, the etching depths through the intermediate oxide (upper oxide layer) to the upper electrode or to a transistor outside the cell array differ considerably.

SUMMARY OF THE INVENTION

In view of this prior art, it is an object of the present invention to provide a semiconductor memory component of the type described in the introduction which has a significantly more uniform topology between the cell arrays and the logic regions and therefore, inter alia, can be metalized with fewer problems.

This object is achieved by the subject matter of claim 1. Advantageous refinements of the invention are given in the subclaims.

Accordingly, according to the invention the difference in topology between the memory cells and the logic regions is substantially compensated for or leveled out by providing dummy structures, the thickness of which corresponds to that of the capacitor structures, in the regions which lie outside the ferroelectric capacitors.

Furthermore, in accordance with an advantageous refinement of the invention, there is provision for the through-contacts in the logic regions which are connected to the transistors provided in these regions to be constructed in a similar way to the thick lower electrode of the capacitors in the cell regions. This means that the contact holes in the upper oxide layer in the logic regions are filled with the same material in the same thickness as the thick capacitor electrodes.

This results, in particular, in a fabrication advantage, since the lower, thick capacitor electrodes, the dummy structures in the logic regions, which consist of the same material as the thick capacitor electrodes, and the contacts in the contact holes of the logic regions can be formed in the same fabrication step. The use of the contact vias in the logic regions also makes the etching depth in the intermediate oxide (upper oxide layer) significantly more uniform.

The overall result is that the difference in topology between the memory cells and the logic regions is according to the invention substantially compensated for, with a difference in thickness in favor of the memory cells existing only to the extent of the thickness of the ferroelectric and the upper electrode of the corresponding capacitor. This difference in thickness is characteristically 200+/−100 nm.

In other words, the particular feature of the invention compared to the prior art is the use of the material for the lower, thicker capacitor electrode both for the dummy structures for level compensation and for the contact vias in the logic regions.

BRIEF DESCRIPTION OF THE DRAWINGS

The invention is explained in more detail below, by way of example, on the basis of exemplary embodiments and with reference to the drawings, in which.

DETAILED DESCRIPTION OF THE INVENTION

Figure 1:
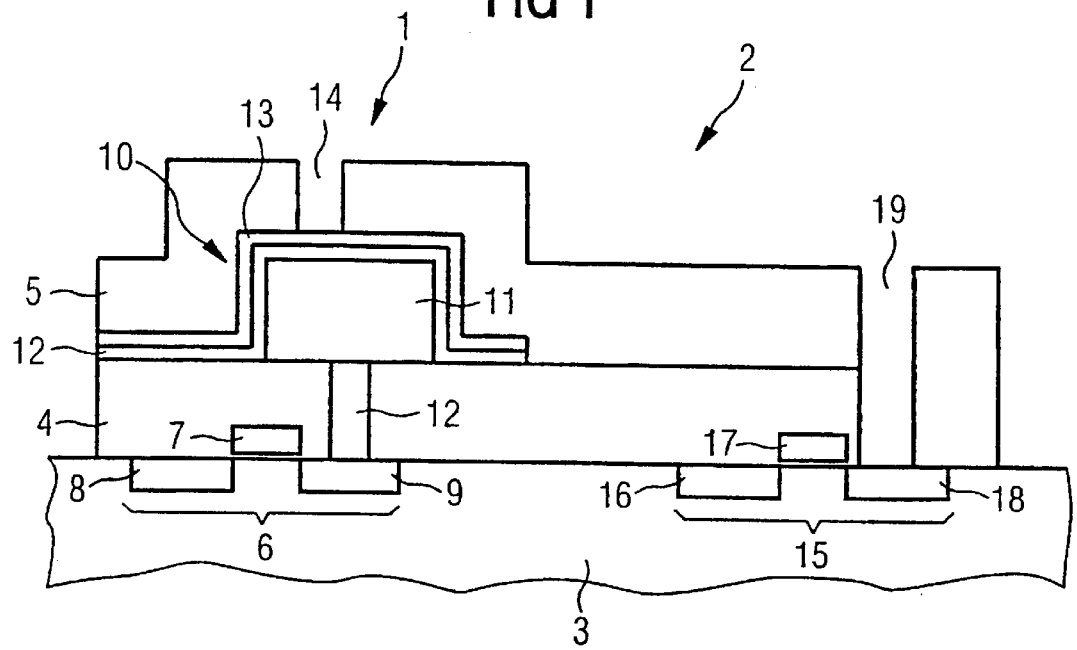
FIG. 1 shows a diagrammatic sectional view through part of a nonvolatile semiconductor memory component with stacked capacitor, in which a memory cell adjoins a logic region, in accordance with the prior art.

The nonvolatile semiconductor memory component, part of which is shown in FIG. 1, comprises a plurality of memory cells and a plurality of logic regions, of which one memory cell and one logic region are shown and are denoted overall by the reference numerals 1 and 2. The semiconductor memory component is, in a known way, of multilayer structure and comprises as the base layer a silicon substrate 3, an oxide layer 4 following the silicon substrate 3, and an upper oxide layer 5 which follows the oxide layer. The lower oxide layer 4 may, by way of example, be a BPSG or TEOS thin film, while the upper oxide layer 5 is formed, for example, as a TEOS thin film or a thin film made from a material with a low dielectric constant (e.g. HPCVD oxide) or combinations thereof. The thicknesses of these layers in the vertical direction are typically several thousand angstrom.

A barrier layer, which is not shown and, by way of example, likewise consists of a $TiO_2$ thin film, is usually provided between the lower oxide layer 4 and the upper oxide layer 5.

In FeRAMs or DRAMs with materials of a high dielectric constant, two barriers, which must differ from one another, are used. The first of these is a barrier between the lower electrode 11 and the plug 12. This barrier is intended to prevent oxidation of the plug 12 (which generally consists of polysilicon) during the annealing of the layer 12. Materials for the barrier are TiN, TaN, TiSiN, TiAlN, TaSiN, $IrO_2$. The second of these barriers is the $H_2$ barrier above the capacitor, which is intended to prevent penetration of $H_2$ during the metalization (e.g. deposition of W) and therefore damage to the layer 12. This layer lies on top of the upper electrode 13. It may also come to lie on the layer 4 in regions outside the capacitors. Typical materials are $Si_3N_4$ or $Al_2O_3$. $TiO_2$ is not particularly suitable, since it is difficult to etch and this barrier layer has to be etched in the contact holes 14 and 19.

The memory cell 1 comprises a transistor 6, preferably a MOSFET transistor, having a gate 7, a source 8 and a drain 9. Source 8 and drain 9 are formed in the silicon substrate 3 adjacent to the lower oxide layer 4, while the gate 7 is formed in the lower oxide layer 4.

The memory cell 1 also comprises a ferroelectric capacitor 10 which comprises a lower, thick electrode 11, which is connected to the drain 9 of the transistor 6 by a via 12, which is a contact hole passing through the lower oxide layer 4 and filled with a metal of good electrical conductivity. Examples of suitable materials for the lower electrode 11 of the capacitor 10 are platinum or iridium as well as the other materials listed above; the material of the via 12 is preferably polysilicon or W. The lower, thick electrode 11 of the capacitor 10 is coated with a ferroelectric or material with a high dielectric constant 12, which surrounds the thick body of the lower electrode 11 on all sides and at the foot of this electrode also extends laterally over a certain distance on the topside of the lower oxide layer 4. The capacitor 10 also comprises an electrode 13 which, as a relatively thin layer, covers the dielectric 12 and is significantly thinner than the lower electrode 11. A contact hole 14 is formed in the upper oxide layer 5 in order to make contact with the upper electrode 13 of the capacitor 10.

In the logic region 2 there is a further transistor 15, which is preferably likewise formed as a MOSFET and comprises a source 16, a gate 17 and a drain 18. The gate, source and drain of the transistor 15 are arranged in the same way as in the transistor 6; i.e. source 16 and drain 18 are arranged in the silicon substrate 3, while the gate 17 is arranged in the lower oxide layer 4. A contact hole 19, which passes all the way through the lower oxide layer 4 and the upper oxide layer 5 and opens out at the topside of the upper oxide 5, is provided for making contact with the drain 18 of the transistor 15.

It can be seen from FIG. 1 that there is a considerable difference in level or topology between the memory cell 1 and the logic region 2, and this leads to the drawback described in the introduction that it is much more difficult to metalize this component and the etching depths through the intermediate oxide or the upper oxide layer 5 to the upper electrode or in the transistor outside the cell array 1 differ very considerably.

Figure 2:
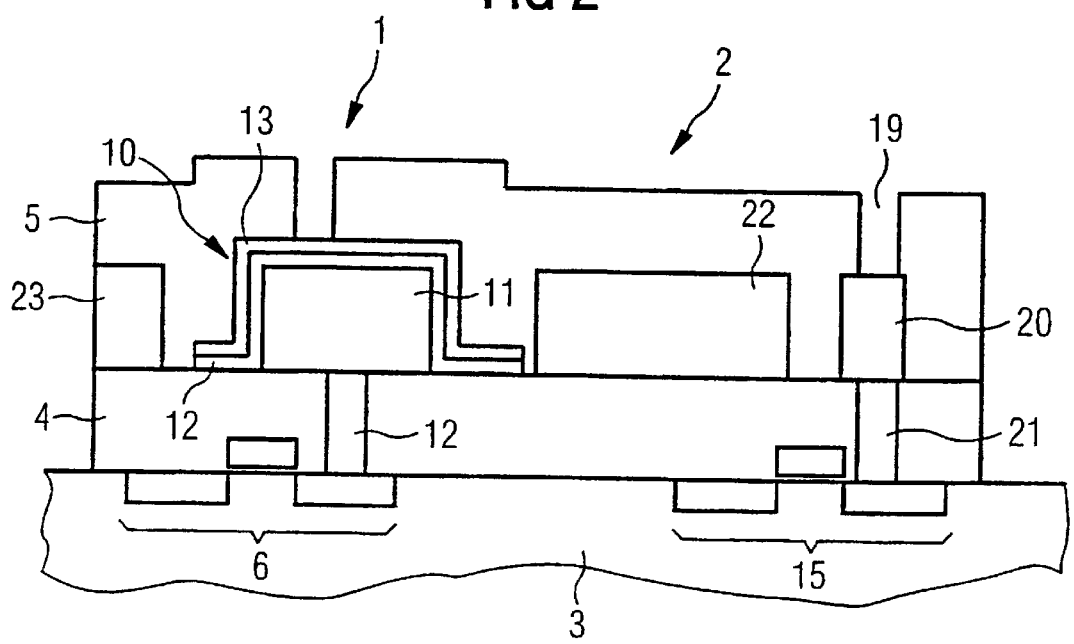
FIG. 2 shows a diagrammatic sectional view through part of a nonvolatile semiconductor memory component in which a memory cell adjoins a logic region, in accordance with the invention.

These drawbacks are overcome by the inventive design of the semiconductor memory component shown in FIG. 2. FIG. 2 shows a similar partial view of a nonvolatile semiconductor memory component to that shown in FIG. 1; those components shown in FIG. 2 which correspond to those shown in FIG. 1 are provided with the same reference numerals. The text which follows will only provide an explanation of the difference between the arrangements shown in FIGS. 1 and 2.

Accordingly, in the contact hole 19 there is a structure whose composition corresponds to that of the structure of the lower electrode 11 of the capacitor 10 and of the via 12. This means that, in the region of the upper oxide layer 5, a plug of material 20 which is of the same thickness as the lower electrode 11 of the capacitor 10 is arranged in the contact hole 19 in the region of the upper oxide layer 5, and a further plug 21, which corresponds to the material filling the via 12, is provided in the lower region of the contact hole 19, inside the lower oxide layer 4. Between the lower, thick electrode 11 of the capacitor 10 and the plug of material 20, there is, made from the same material and in the same thickness as these elements, a dummy structure 22 which adjoins the barrier layer on the lower oxide layer 4. A further dummy structure 23 of this type is shown on the other side of the capacitor 10, in FIG. 2 to the left of that provided and denoted by the reference numeral 23.

As can be seen from a comparison between FIG. 1 and FIG. 2, the arrangement shown in FIG. 2 has a topology which is substantially balanced, i.e. there is scarcely any difference in level, apart from the difference in level which results from the fact that the lower, thick electrode 11 of the capacitor 10 is coated with the dielectric 12 and the upper electrode 13, between the memory cell 1 and the logic region 2. On account of this leveled topology, the required planarization can be carried out without problems by chemical mechanical polishing for the required metalization, and the etching depth through the intermediate oxide or the upper oxide layer 5 to the upper electrode and to a transistor outside the cell array 1 is very uniform.

Although the present invention has been described above with reference to preferred exemplary embodiments, it is not restricted to these embodiments, but rather can be modified in numerous ways.

A further possibility is the offset structure, in which the capacitor and transistor are connected from above by the metalization over the upper electrode.

What is claimed is:

1. A semiconductor memory component, having memory cells, logic regions and dummy structures with random access, also having a structure which is differentiated into memory cells and logic regions and has a lower oxide layer arranged on a silicon substrate and an upper oxide layer arranged on the lower oxide layer, each memory cell comprising at least one transistor in the transition region between silicon substrate and lower oxide layer and a capacitor in the transition region between lower oxide layer and upper oxide layer, which capacitor is connected to the transistor via a contact hole, which is filled with a conductive material, in the lower oxide layer and comprises a ferroelectric arranged between two electrodes, the electrode which is connected to the transistor and adjoins the lower oxide layer, and each logic region comprising at least one transistor in the transition region between silicon substrate and lower oxide layer, which transistor is connected to an electrode on the topside of the upper oxide layer via a contact hole, which is filled with a conductive material, in the lower oxide layer and the upper oxide layer, in which component between the capacitors of the memory cells and the contact holes in the logic regions, level compensation between the topology of the memory cells and of the logic regions is created by dummy structures, wherein in the contact hole there is a structure, the composition of which corresponds to that of the structure of the lower electrode of the capacitor and of the contact hole, as a result of a plug of material, which is of the same thickness as the lower electrode, being arranged in the contact hole in the region of the upper oxide layer, and as a result of a further plug, which corresponds to the material filling the contact hole, being provided in the lower region of the contact hole inside the lower oxide layer.

2. The semiconductor memory component as claimed in claim 1, wherein, as an offset structure, the capacitor and the transistor are connected from above by a metalization over the upper electrode.

3. The semiconductor memory component as claimed in claim 1, wherein the dummy structure comprises islands of material with a thickness which substantially corresponds to that of the lower electrode of the capacitor.

4. The semiconductor memory component as claimed in claim 3, wherein the dummy structure islands consist of the same material as the lower electrode of the capacitor.

5. The semiconductor memory component as claimed in claim 1, wherein the contact holes in the logic regions, in order to connect the transistors of the logic regions to the associated electrodes on the topside of the upper oxide layer, at least in the region of the upper oxide layer consist of the same material as the lower electrode of the capacitor, with substantially the same thickness as the lower electrode of the capacitor.

6. The semiconductor memory component as claimed in claim 1, wherein the contact holes in the lower oxide layer also consist of the metal material from which the lower electrode of the capacitor are formed.

7. The semiconductor memory component as claimed in claim 1, wherein the upper electrode of the capacitor consist of the same metal material as the lower electrode of the capacitor.

8. The semiconductor memory component as claimed in claim 1, wherein the thick capacitor electrodes consist of platinum, iridium, iridium dioxide, ruthenium, ruthenium dioxide, palladium, strontium-ruthenium trioxide or combinations thereof.

9. The semiconductor memory component as claimed in claim 1, wherein a plug of material which is of the same thickness as the lower electrode of the capacitor is arranged in the contact hole.

10. The semiconductor memory component as claimed in claim 1, wherein a plug which corresponds to the material filling the via is provided in the lower region of the contact hole, inside the lower oxide layer.

* * * * *